US006960908B2

(12) United States Patent
Chung et al.

(10) Patent No.: US 6,960,908 B2
(45) Date of Patent: Nov. 1, 2005

(54) METHOD FOR ELECTRICAL TESTING OF SEMICONDUCTOR PACKAGE THAT DETECTS SOCKET DEFECTS IN REAL TIME

(75) Inventors: Ae-yong Chung, Chungcheongnam-do (KR); Sung-Ok Kim, Chungcheongnam-do (KR); Jeong-ho Bang, Kyunggi-do (KR); Kyeong-seon Shin, Kyunggi-do (KR); Dae-gab Chi, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/824,220

(22) Filed: Apr. 13, 2004

(65) Prior Publication Data

US 2004/0207387 A1 Oct. 21, 2004

(30) Foreign Application Priority Data

Apr. 15, 2003 (KR) ................................ 10-2003-0023735

(51) Int. Cl.[7] ................................................ G01R 31/02
(52) U.S. Cl. .................................... 324/158.1; 324/765
(58) Field of Search ...................... 324/158.1, 760–765; 438/14–18; 257/40, 48; 702/117, 121; 414/590–592, 225.01, 940, 222.09; 209/571–573

(56) References Cited

U.S. PATENT DOCUMENTS 4,924,179 A * 5/1990 Sherman .................... 324/755
5,283,605 A * 2/1994 Lang-Dahlke .............. 324/754
5,436,570 A * 7/1995 Tan ........................... 324/761
5,621,312 A * 4/1997 Achor et al. ............. 324/158.1
5,907,247 A * 5/1999 Vogley ....................... 324/765
6,323,666 B1 * 11/2001 Ohba ......................... 324/760

FOREIGN PATENT DOCUMENTS

| | | |
|---|---|---|
| JP | 2000193718 | 7/2000 |
| KR | 10-0269942 | 7/2000 |
| KR | 1020020077598 | 10/2002 |
| KR | 10-0372881 | 2/2003 |

OTHER PUBLICATIONS

English language abstract of Korean Registration No. 10–0372881.
English language abstract of Korean Registration No. 10–0269942.
English language abstract of Japanese Publication No. JP2000193718.
English language abstract of Korean Publication No. 1020020077598.

* cited by examiner

*Primary Examiner*—Vinh P. Nguyen
(74) *Attorney, Agent, or Firm*—Marger Johnson & McCollom, P.C.

(57) ABSTRACT

An electrical testing method for a semiconductor package for detecting defects of sockets mounted on a device under test (DUT) board is provided. A tester performs electrical test, accumulates electrical test results, and compares the accumulated results to reference values. The result of the comparison decides whether a plurality of sockets mounted on the DUT board can be used or not. The decision results are transmitted to a handler so that the socket having the defects is not used on the DUT board.

13 Claims, 7 Drawing Sheets

FIG. 6

1-CYCLE DATA ■••➡ ACCUMULATED DATA

| SOCKET NO (210) | TEST ITEM (220) | TOTAL Q'TY (230) | PASS (240) | FAIL (250) | REFERENCE DATA (260) |
|---|---|---|---|---|---|
| 32 | OPEN | 1 | 1 | 0 | 20 |
| | SHORT | 1 | 1 | 0 | 20 |
| | LEAKAGE | 1 | 1 | 0 | 30 |
| | TIMING | 1 | 1 | 0 | 10 |
| 33 | OPEN | 1 | 1 | 0 | 20 |
| | SHORT | 1 | 1 | 0 | 20 |

■••➡

| SOCKET NO (310) | TEST ITEM (320) | TOTAL Q'TY (330) | PASS (340) | FAIL (350) | REFERENCE DATA (360) |
|---|---|---|---|---|---|
| 32 | OPEN | 200 | 199 | 1 | 20 |
| A | SHORT | 200 | 150 | 50 | 20 |
| | LEAKAGE | 200 | 150 | 50 | 30 |
| | TIMING | 200 | 150 | 50 | 10 |
| 33 | OPEN | 200 | 199 | 1 | 20 |
| | SHORT | 200 | 199 | 1 | 20 |
| B | LEAKAGE | 200 | 162 | 38 | 30 |
| | TIMING | 200 | 161 | 39 | 10 |
| 34 | OPEN | 200 | 199 | 1 | 20 |
| | SHORT | 200 | 199 | 1 | 20 |
| | LEAKAGE | 200 | 198 | 2 | 30 |
| C | TIMING | 200 | 187 | 13 | 10 |
| | - | - | - | - | - |
| | | - | - | - | - |
| | | | - | - | |

METHOD FOR ELECTRICAL TESTING OF SEMICONDUCTOR PACKAGE THAT DETECTS SOCKET DEFECTS IN REAL TIME

CROSS REFERENCE TO RELATED APPLICATIONS

This application claims priority from Korean Patent Application No. 2003-23735, filed on Apr. 15, 2003, in the Korean Intellectual Property Office, the disclosure of which is incorporated herein by reference in its entirety.

BACKGROUND OF THE INVENTION

1. Field of the Invention

This disclosure relates to an electrical testing method for a semiconductor package, and more particularly, to an electrical testing method for a semiconductor package related to socket defects on a device under test (DUT) board.

2. Description of the Related Art

A tester is an automated device combining hardware and software for performing an electrical test of a semiconductor device. Generally, memory semiconductor devices such as dynamic random access memories (DRAMs) gradually increase in capacity and the number of pins. Accordingly, a tester for the semiconductor memory device has been developed that focuses on high throughput.

When the capacity of the semiconductor memory device becomes larger, the cost for the electrical test increases since the time required to perform the electrical test increases. Thus, in order to solve the above problem, the tester for the semiconductor memory device generally adopts a parallel testing method.

The parallel testing method is a method for testing a plurality of semiconductor devices at one time, instead of testing the semiconductor devices one by one. The parallel test for 32 and 64-DRAM devices has been utilized, and the parallel test for 128-DRAM semiconductor device is about to be utilized.

FIG. 1 is a block diagram for illustrating conventional concepts of the tester for testing a device under test (DUT). Referring to FIG. 1, the tester 1000 comprises a micro processor 1100 therein for controlling entire tester, and the micro processor 1100 is operated with a file memory 1200 to store program files required to test the semiconductor device electrically, store the testing results, and store system programs required to control entire tester 1000.

In addition, in the tester, hardware required to test electrically the semiconductor device such as a timing generator, a pattern generator, a wave formatter, a logic comparator, a power source for input/output, a direct current (DC) measuring unit, and a programmable power supply are built-in. The tester 1000 is generally operated with an automated robot known as the handler (2000 in FIG. 2). Thus, the DUT is loaded on a test site 2100 existing in the handler, and the functions are tested electrically.

FIG. 2 is a block diagram for describing functions of the conventional handler. Referring to FIG. 2, the handler 2000 is an automated testing robot independently controlled by a micro processor 2200 that communicates with the micro processor in the tester 1000. The handler 2000 includes a loading unit 2300 for loading the DUT from the outside and moving the DUT to the test site 2100 therein. Also, the handler 2000 includes an unloading unit 2400 for conveying the tested DUT to the outside. The handler 2000 also includes a discriminating unit 2500 that receives the electrical test results from the tester 1000 through an information signal cable 2700 to discriminate whether the DUT is acceptable or not.

A test site temperature controlling unit 2600 controls a temperature of an area where the DUT is tested. For example, the test site 2100 may be at high temperature, a room temperature, or a low temperature, to test whether the semiconductor device performs correctly regardless of the changes in the temperature. The test site 2100 is an area electrically connecting the DUT with the tester 1000 through a DUT board, and is connected to the tester 1000 via a test signal cable 2800.

Thus, the handler 2000 loads the DUT from outside so that it is connected to the tester 1000 via the information signal cable 2700 and the test signal cable 2800, and carries the DUT on a socket of the DUT board existing on the test site 2100, and after that, transmits a test start signal to the tester 1000. When the handler 2000 receives a test ending signal from the tester 1000, it discriminates the DUT on the socket and unloads the DUT according to the test result received with the test ending signal.

FIG. 3 is a plane diagram illustrating the conventional DUT board mounted on the test site of the handler. Referring to FIG. 3, the DUT board 2110 has a configuration that a plurality of sockets 2104 are mounted on a printed circuit board 2102 in a matrix form. However, the socket 2104 does not last permanently, and defects are often generated as the socket 2104 becomes worn and damaged. Accordingly, the tester may perform an abnormal electrical test for the DUT. Thus, the accuracy of the electrical test is reduced because of a quality problem, and re-test should be performed.

To solve the above problem in advance, the socket defects of the DUT board should be quickly found and the defects should be fixed or replaced. However, it is difficult to recognize the states of a plurality of sockets mounted on a lot of DUT boards, and to fix or replace the sockets. Also, since many other defects may be generated during the fixing and replacing of the sockets by manual work, the socket test through automation is considered a more effective solution for solving the above problems.

Embodiments of the invention address these and other disadvantages of the conventional art.

SUMMARY OF THE INVENTION

Embodiments of the invention provide an electrical testing method for a semiconductor package that is capable of inspecting defects of a socket mounted on a device under test (DUT) board in real-time to deal with the defects.

BRIEF DESCRIPTION OF THE DRAWINGS

The above and other features and advantages of the invention will become more apparent by describing in detail exemplary embodiments thereof with reference to the attached drawings.

FIG. 6 illustrates example data sheets of electrical test results and accumulated test results stored in a file memory of the tester according to some embodiments of the invention.

DETAILED DESCRIPTION OF THE INVENTION

As described below, the device under test (DUT) board according to some embodiments of the invention encompasses the broadest meaning thereof, and is not limited to a certain shape described in following preferred embodiment.

The invention may be practiced in various ways without departing from the spirit and scope of the invention. For example, a semiconductor device in the preferred embodiment will be described in view of dynamic random access memory (DRAM), however, any kind of semiconductor device which can be tested by a parallel testing method can be used as the semiconductor package. Also, in the embodiments described below, continuity test results, leakage test results, and timing test results for individual sockets are accumulated in a memory of the tester, however, it is recognized that other test results by which the socket defects can be recognized may be added thereto. Thus, the following description of some of the embodiments is an example, and is not limited thereto.

Figure 1:
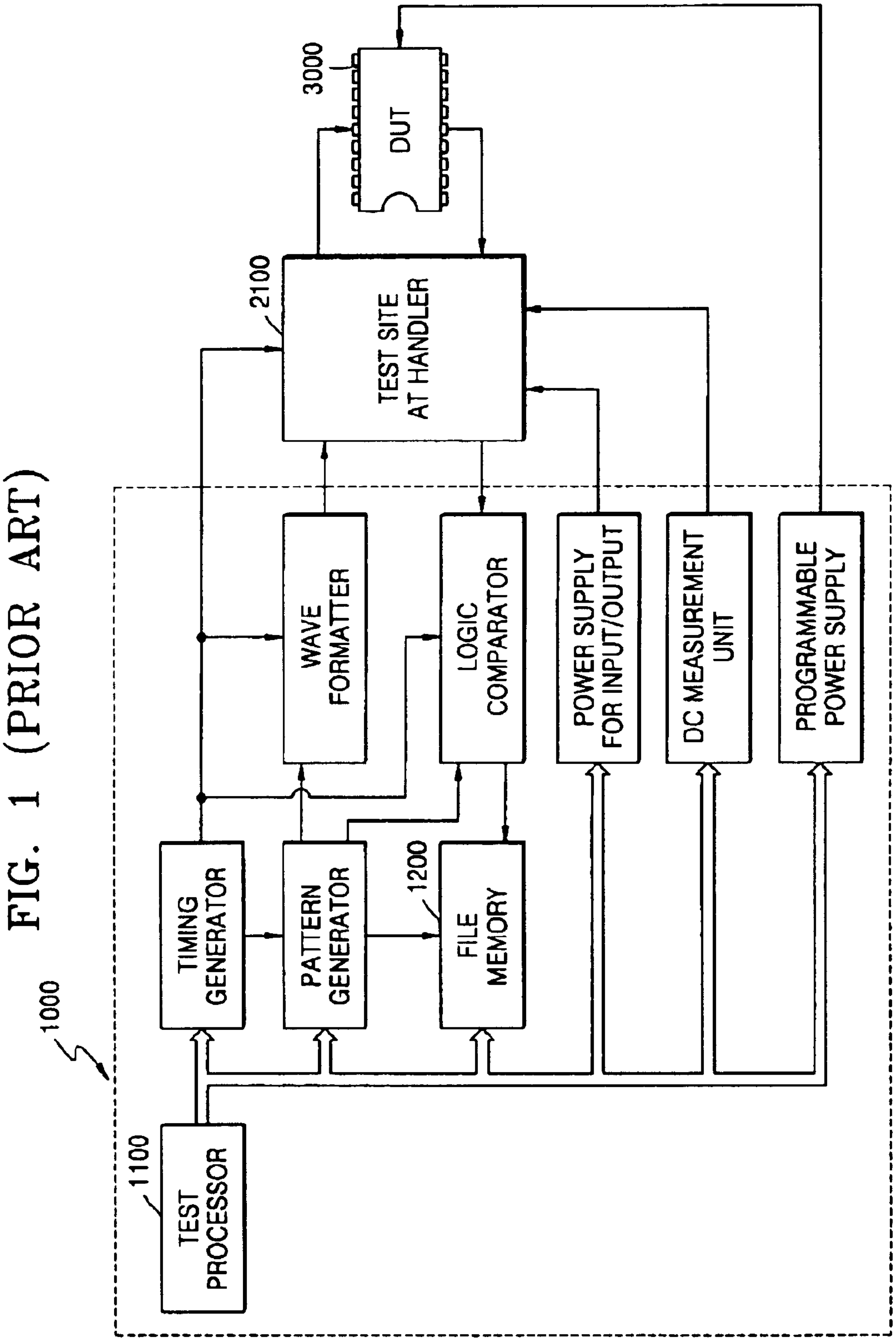
FIG. 1 is a block diagram illustrating a conventional tester for testing a device under test (DUT).
Figure 2:
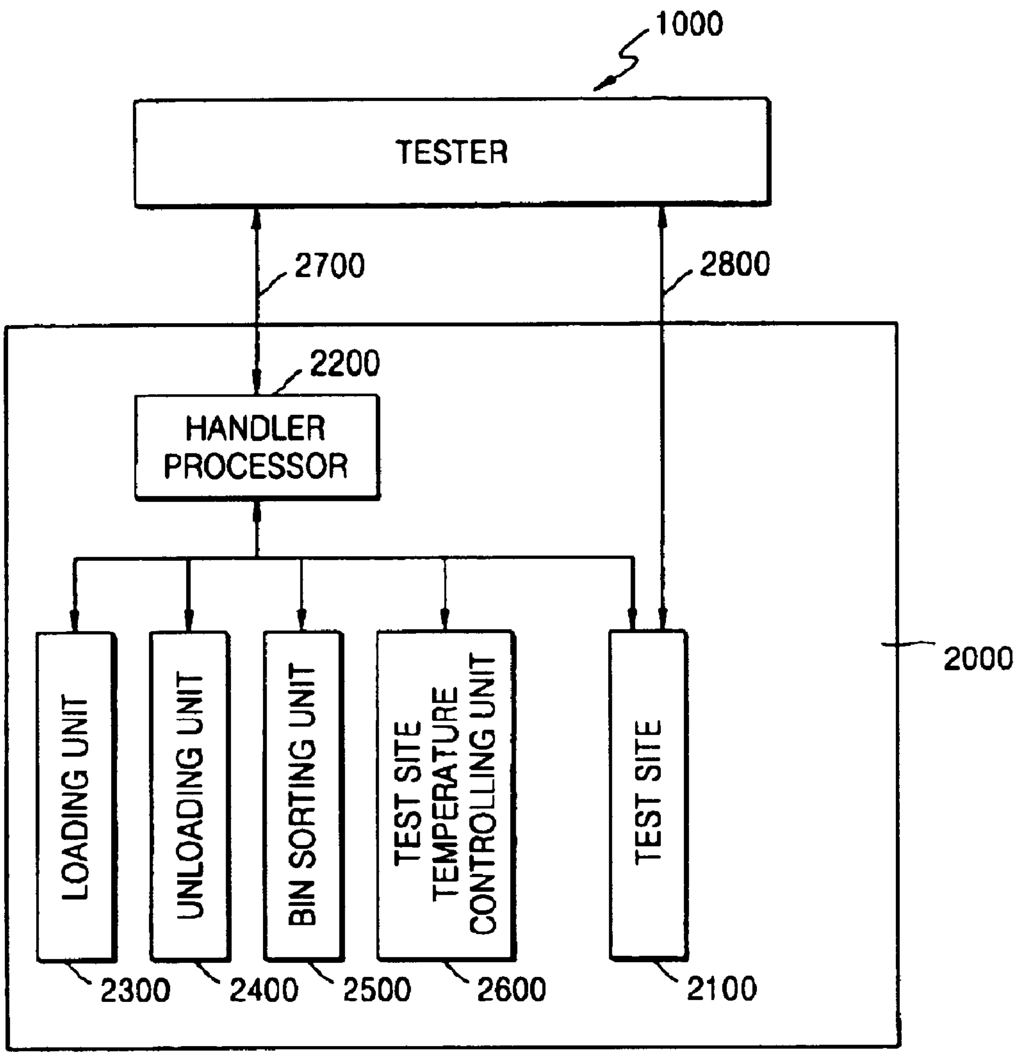
FIG. 2 is a block diagram illustrating a conventional handler connected to the tester of FIG. 1.
Figure 3:
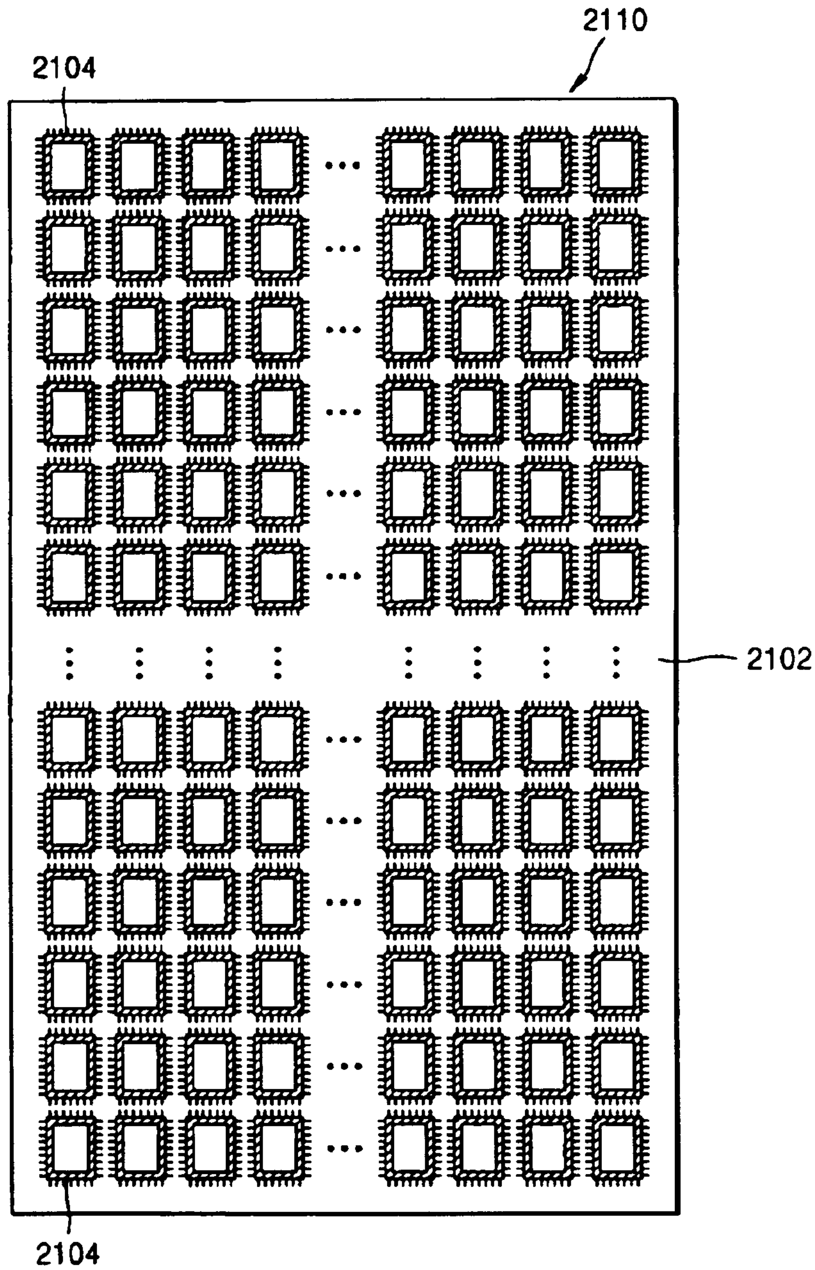
FIG. 3 is a plane diagram illustrating a conventional DUT board mounted on a test site of the handler.
Figure 4:
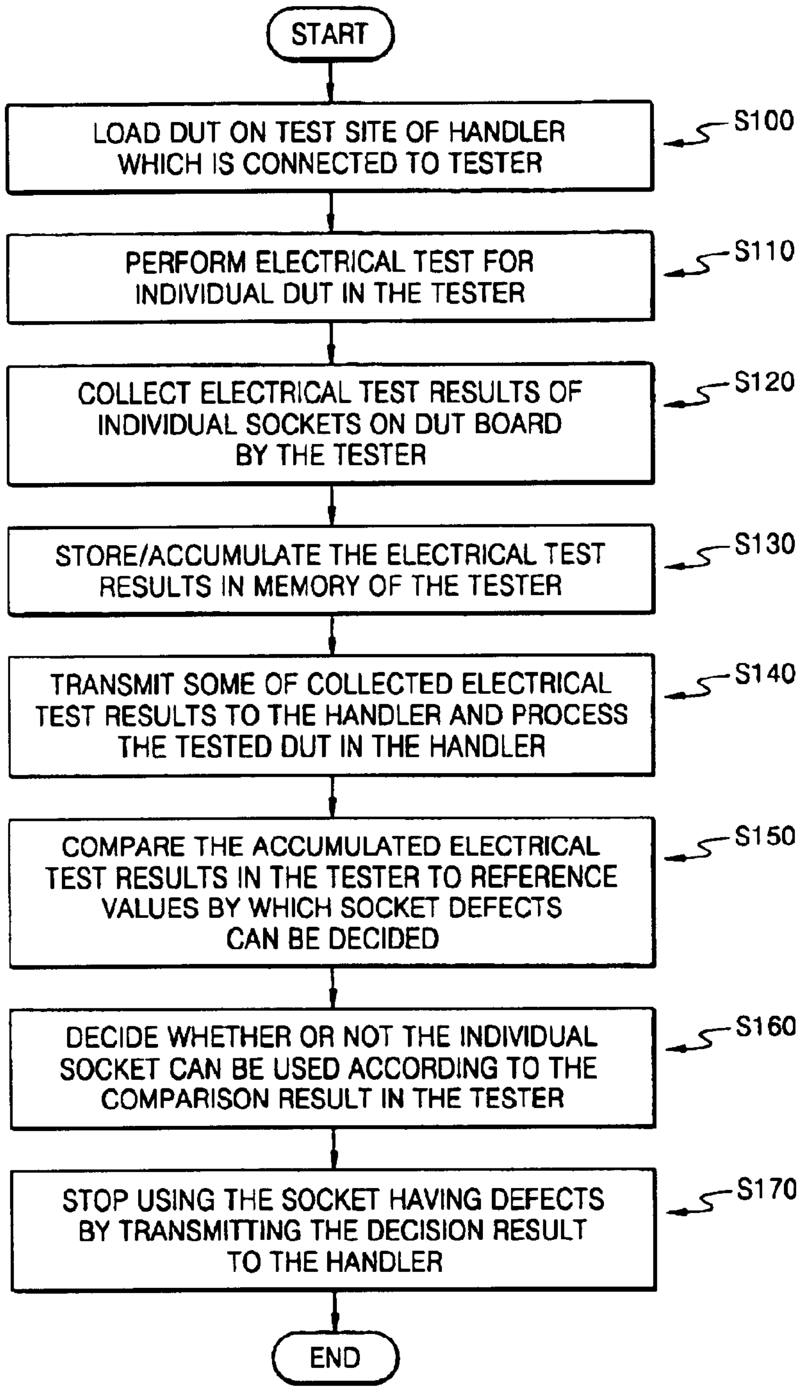
FIG. 4 is a flow diagram illustrating an electrical testing method for a semiconductor package that is capable of detecting socket defects in real-time according to some embodiments of the invention.

FIG. 4 is a flow diagram illustrating an electrical testing method for a semiconductor package that is capable of recognizing socket defects in real-time according to some embodiments of the invention. Referring to FIG. 4, an electrical testing apparatus in a stand-by status by combining a tester and a handler is set up. Generally, the handler can be classified as a horizontal type handler or a vertical type handler. It is preferable that a horizontal type handler is used in cases where a plurality of DUTs are tested at one time, such as with embodiments of the invention.

Afterwards, the DUT is loaded on a test site of the handler (S100). It is preferable that the DUT is a memory device, for example, a DRAM device. The test site is above a DUT board made by mounting a plurality of sockets for electric parallel test on a printed circuit board. Then, the tester tests electric functions of the DUTs loaded on the DUT board at one time by operating a test program (S110).

The tester collects electrical test results of the individual sockets on the DUT board (S120), stores the results in a file memory in the tester, and accumulates the stored electrical test results of the individual sockets (S130). The above series of processes for collecting the electrical test results, storing and accumulating the results of the individual sockets in the file memory of the tester are performed by software in a test program.

The electrical test results of the individual sockets include continuity test results, leakage test results, and timing test results. However, other test results by which the socket defects can be found may also be collected. The detailed test results of all test items for the semiconductor device are stored in the file memory in the tester. The detailed test results allow socket defects to be detected more precisely than with the method of detecting the socket defects by pass/fail results of the DUT.

Open/short of a connecting path of the socket can be recognized by the results of the continuity test, a leakage path of current generated on the connecting path of the socket can be recognized by the leakage test, and a propagation delay which may be generated on the connecting path of the socket can be recognized by the timing test results. Thus, the electrical test results collected by the tester include detailed information by which the above problems can be detected, since the electrical test results collected by the tester include testing conditions, measured values, critical limits, and pass/fail results for the continuity test, the leakage test, and the timing test.

Next, some of the electrical test results collected in the tester, for example, sorting data deciding the pass/fail of the DUT, is transmitted to the handler. The handler receiving the sorting data for deciding the pass/fail physically performs a process for discriminating the DUT passed through the electrical test by the control of an inner micro processor (S140).

On the other hand, the tester compares the electrical test results accumulated in the file memory to reference values by which the socket defects can be decided (S150), after a predetermined time passes since the test has started or when the tests for a predetermined number of DUTs are completed. The reference value may be the number of defects in the continuity test, the number of defects in the leakage test, and the number of defects in the timing test. Also, instead of the number of defects, an average value of the measured values, or a value of a certain socket exceeding the measured values of other sockets can be compared with the test results. The comparison may be performed automatically after a predetermined time passes from the start of the electrical test for the DUT, or may be performed after performing the electrical tests for a predetermined number of DUTs. The comparison is performed using the software by the control of the test program in the tester.

The tester decides whether or not the individual socket can be used continuously according to the comparison results (S160). The tester transmits the decision results, that is, the defect data for the individual sockets to the handler. The micro processor of the handler receiving the decision data controls the hardware existing therein to stop using the socket having the defects (S170).

Figure 5:
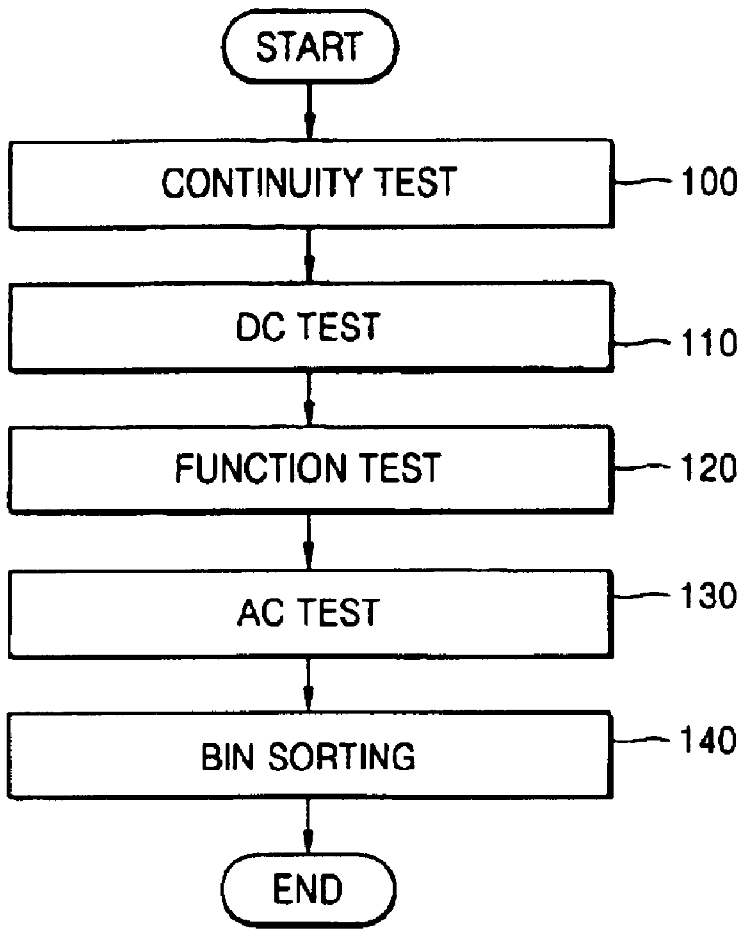
FIG. 5 is a flow diagram illustrating electrical testing items and testing order of a general memory device.

FIG. 5 is a flow chart of items and order of the electrical tests for the general memory device. Referring to FIG. 5, in the electrical test program for the general memory device, it is identified that the tester and the DUT are connected to each other correctly in the continuity test 100. The continuity test 100 includes an open test and a short test. Here, the open and short generated in the DUT are detected by the continuity test 100. Also, the open and the short generated on the connecting path between the DUT and the tester are detected by the continuity test 100.

Generally, a wafer fabricating process, an assembling process, and the electrical test process for the DUT are dealt as one lot unit. Thus, the DUTs under the electrical test in a certain tester have nearly same electrical properties as each other if their lots are same as each other. When it is assumed that 64 DUTs are inserted into 64 sockets mounted on the DUT board and the parallel test is performed for the DUTs, and results of the continuity test 100 are pass on 63 sockets and fail on one socket, then, the defect generated on the socket may be the defect of socket itself. It is because that the 64 DUTs are dealt as one lot from the wafer fabricating process to the electrical test process, and thus, the 64 DUTs have nearly same electrical properties.

Next, the electrical test program operated in the tester performs a direct current (DC) test 110, for example, the leakage test. In the leakage test, the currents are measured on every pins of the DUT after applying voltages to the pins, or the voltages are measured after applying the currents. The leakage test is for checking stability of power supply wiring for the connecting path, checking required current, and measuring the leaked current in the DUT and in the tester.

If a certain socket passes the continuity test, but fails continuously in the leakage test, it may be the socket defect, since the DUTs included in a lot have similar electric properties. Also, if a measured value of a certain socket is abnormally higher than those of other sockets, it can be analogized that the socket status is degraded in considering that the DUTs included in one lot have similar electric properties.

The electrical test program operated in the tester performs a function test 120. The function test is for checking functions in an actual operating situation of the DUT, that is, the DRAM. That is, the test writes data on a memory cell of the DRAM and reads out the written data. In detail, a test pattern generator in the tester applies an input pattern to the DUT, and checks the output of the DUT to identify a defective memory cell using a comparison circuit of tester.

Next, the electrical test program operated in the tester performs a timing test, that is, an alternating current (AC) test 130. The timing test 130 is for checking pulses of an output terminal after applying pulses to an input terminal of the DUT to check the input/output propagation delay time. If there is an element which may cause the propagation delay in the hardware existing in the DUT or on the connecting path such as the socket, the element can be identified by the timing test 130.

If defects are generated on a certain socket continuously by the timing test, the certain socket may be defective since the DUTs included in one lot have similar electric properties. Also, if a certain socket has abnormally higher measured value than those of other sockets, it can be analogized that the socket status is degraded in considering that the electric properties of DUTs included in one lot are similar to each other.

FIG. 6 illustrates example data sheets of electrical test results and accumulated test results stored in the file memory of the tester according to some embodiments of the invention. Referring to FIG. 6, the sheet on the left side presents the test result of one electrical test, and the sheet on the right side presents the accumulated electrical test results of two hundreds tests. In the sheets presenting the electrical test results, socket Nos. 210 and 310 are numbers of certain sockets among a plurality of sockets mounted on the DUT board. Also, test items 220, and 320 denote test items performed by the test program, while total qualities 230 and 330 denote the number of DUTs inspected in a certain socket so far. Passes 240 and 340 and fails 250 and 350 denote the number of DUTs deemed to pass the test and the number of DUTs deemed to fail the test, respectively. Reference data 260 and 360 denote reference values for comparing the measured values, respectively.

Figure 7:
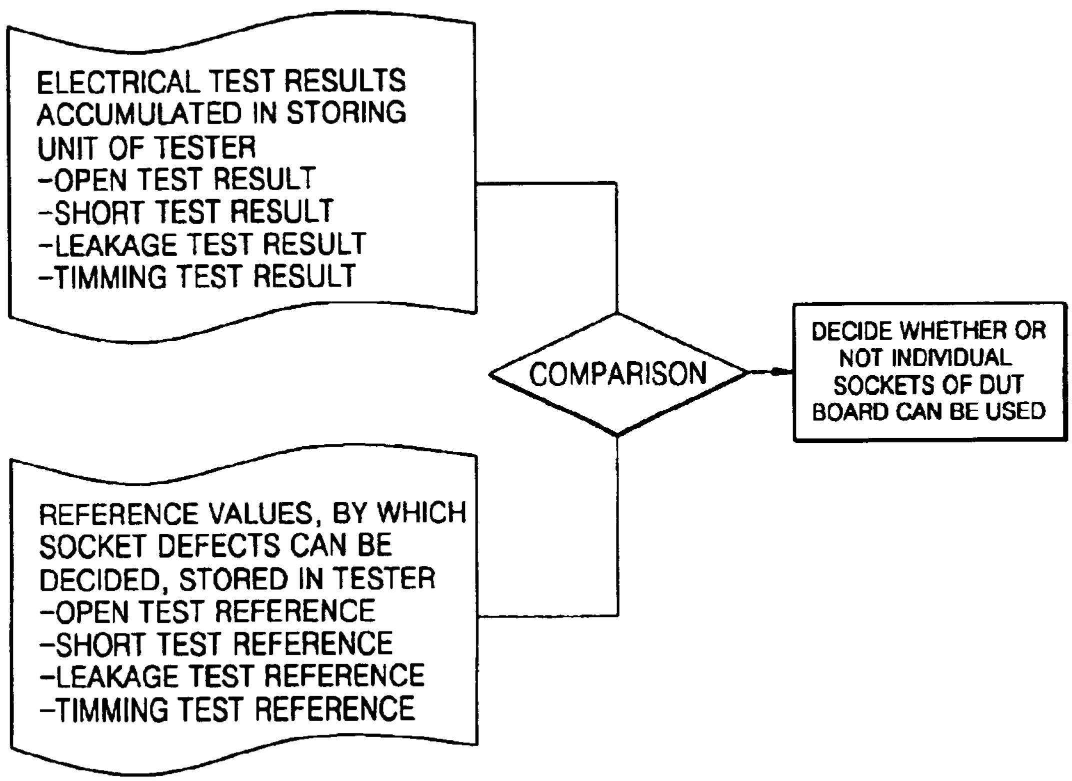
FIG. 7 is a flow diagram illustrating procedures for deciding whether individual sockets of the DUT board may be used according to some embodiments of the invention.

FIG. 7 is a flow diagram illustrating procedures for deciding whether the individual socket of the DUT board may be used according to some embodiments of the invention. Referring to FIG. 7, in the procedures for deciding whether or not the socket can be used in the tester, the accumulated electrical test results stored in the file memory of the tester, for example, the continuity test results, the leakage test results, and the timing test results are compared to the reference values (360 of FIG. 6) by which the socket defects can be identified.

In FIG. 6, section A is a decision result that the socket No. 32 is defective since defects are generated on 50 DUTs in the short test and that exceeds the reference value, 20 DUTs, after checking 200 DUTs on the socket No. 32. Also, section B of FIG. 6 is a decision result that socket No. 33 has a defect since 38 DUTs has defects in the leakage test and that exceeds the reference value 30 after testing 200 DUTs on the socket No. 33. Section C of FIG. 6 is a decision result that the socket No. 34 is in defective status after the timing test since 13 DUTs have defects and that exceeds the reference value 10 after testing 200 DUTs on the socket No. 34.

The decision of defect is made in view of the number of defects in the test result sheets. However, the test results that can be collected by the tester may be testing conditions, measured values, or critical limits besides the number of defects. Thus, instead of using the number of defects, an average value of the measured values may be used for detecting the socket defects, or a socket having a measured value abnormally higher than those of other sockets may be deemed to be the defective socket so that usage of the socket is abandoned on the DUT board.

Therefore, according to embodiments of the invention, fixing and replacing of the socket can be performed effectively, and the accuracy of the electrical test for the semiconductor device can be improved. Also, the efficiency of the testing processes can be improved since the re-test processes are reduced, and the productivity of the electrical test process for the semiconductor device can be improved since management items performed by manual work are reduced.

There are many ways to practice the invention. What follows are exemplary, non-limiting descriptions of some embodiments of the invention.

According to some embodiments of the invention, an electrical testing method for a semiconductor package is provided for detecting socket defects in real-time that includes loading a device under test (DUT) on a test site of a handler on which a tester and the handler are connected to each other through a DUT board, performing electrical tests for the DUT by operating the tester, collecting results of the electrical test for individual sockets of the DUT board by the tester, storing the electrical test results of the individual sockets on the DUT board in a memory of the tester and accumulating the results, transmitting some of the collected electrical test results to the handler and processing the DUT according to the received electrical test results by the handler, comparing the electrical test results of the individual sockets on the DUT board accumulated in the memory of the tester to reference values by which socket defects can be decided, deciding whether or not the individual sockets of the DUT board can be used according to the comparison results, and stopping usage of the defective socket on the DUT board by transmitting the decision result to the handler.

According to preferred embodiments of the invention, it is preferable that a plurality of DUTs, for example, a plurality of semiconductor memory devices, are mounted on the DUT board and electrical tests for the plurality of DUTs are peformed at the same time. The electrical test results of individual sockets accumulated in the memory of the tester may include continuity test results, leakage test results, or timing test results.

Preferably, the electrical test results of the individual sockets accumulated in the memory may be compared to the reference values by which the socket defects can be decided after passing a predetermined time since the electrical test has started, or after completing the electrical tests for a predetermined number of DUTs.

The reference values by which the socket defects can be decided may include the number of defects in the continuity test, the number of defects in the leakage test, or the number of defects in the timing test.

According to embodiments of the invention, fixing and replacing of the socket can be performed effectively, and an accuracy of the electrical test for the semiconductor device can be improved. Also, an efficiency of the testing processes can be improved since the re-test processes can be reduced, and a productivity of the electrical test process for the semiconductor device can be improved since management items performed by manual work can be reduced.

While the invention has been particularly shown and described with reference to exemplary embodiments thereof, it will be understood by those of ordinary skill in the art that various changes in form and details may be made therein without departing from the spirit and scope of the invention as defined by the following claims.

We claim:

1. A method comprising:

loading a device under test on a test site of a handler, the handler connected to a tester through a device under test board;

performing electrical tests on the device under test by operating the tester;

collecting results of the electrical test for individual sockets on the device under test board using the tester;

storing the electrical test results of the individual sockets on the device under test board in a storing unit of the tester and accumulating the results;

transmitting a part of the collected electrical test results to the handler and processing the device under test according to the received electrical test results;

comparing the accumulated electrical test results of the individual sockets on the device under test board to a reference value;

using the individual sockets on the device under test board based upon the comparison results; and stopping use of a defective socket on the device under test board by transmitting the decision result to the handler.

2. The method of claim 1, wherein loading a device under test on a test site of a handler comprises loading the device under test on a horizontal type handler.

3. The method of claim 1, wherein the handler is operated by a first microprocessor that is different from a second microprocessor that operates the tester.

4. The method of claim 1, wherein performing electrical tests comprises simultaneously performing a parallel test for a plurality of devices under test mounted on the device under test board.

5. The method of claim 1, wherein loading a device under test comprises loading a memory device.

6. The method of claim 5, wherein loading a memory device comprises loading a dynamic random access memory (DRAM).

7. The method of claim 1, wherein collecting results of the electrical test for individual sockets comprises:

collecting continuity test results;

collecting leakage test results; and collecting timing test results.

8. The method of claim 1, wherein transmitting a part of the collected electrical test results comprises transmitting sorting data for processing the devices under test after finishing the electrical test.

9. The method of claim 1, wherein comparing the electrical test results comprises comparing the electrical test results after a predetermined time has passed since the electrical test started.

10. The method of claim 1, wherein comparing the electrical test results comprises comparing the electrical test results after completing the electrical test for a predetermined number of devices under test.

11. The method of claim 1, wherein comparing the accumulated electrical test results to a reference value comprises comparing a number of defects in the continuity test to the reference value.

12. The method of claim 1, wherein comparing the accumulated electrical test results to a reference value comprises comparing a number of defects in the leakage test to the reference value.

13. The method of claim 1, wherein comparing the accumulated electrical test results to a reference value comprises comparing a number of defects in the timing test to the reference value.

* * * * *